(12) United States Patent
Yeh (10) Patent No.: US 10,412,841 B2
(45) Date of Patent: Sep. 10, 2019

(54) FLEXIBLE PRINTED CIRCUIT BOARD AND METHOD FOR MANUFACTURING THE SAME

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventor: Tzu-Chien Yeh, New Taipei (TW)

(73) Assignees: Avary Holding (Shenzhen) CO., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 2 days.

(21) Appl. No.: 15/833,178

(22) Filed: Dec. 6, 2017

(65) Prior Publication Data
US 2019/0116677 A1 Apr. 18, 2019

(30) Foreign Application Priority Data

Oct. 13, 2017 (CN) .......................... 2017 1 0954392

(51) Int. Cl.
*H05K 3/46* (2006.01)
*H05K 3/40* (2006.01)
(Continued)

(52) U.S. Cl.
CPC ......... *H05K 3/4691* (2013.01); *H05K 1/0278* (2013.01); *H05K 1/0353* (2013.01);
(Continued)

(58) Field of Classification Search
CPC ........ H05K 3/42; H05K 3/429; H05K 3/4038; H05K 3/40–429; H05K 3/4691;
(Continued)

(56) References Cited

U.S. PATENT DOCUMENTS

5,121,299 A * 6/1992 Frankeny .......... H01L 23/49816
174/261
6,076,726 A * 6/2000 Hoffmeyer .......... B23K 1/0016
228/180.22
(Continued)

*Primary Examiner* — Peter Dungba Vo
*Assistant Examiner* — Kaying Kue
(74) *Attorney, Agent, or Firm* — ScienBiziP, P.C.

(57) ABSTRACT

A FPCB includes a base layer defining at least one first through hole. A conductive paste block is formed in each first through hole. Each conductive paste block includes a first and a second end portion. The base layer has opposite surfaces, and a first conductive wiring layer is formed on each surface of the base layer. The first end portion at least protrudes from the base layer and is exposed from the first conductive wiring layer. An insulating layer and a second conductive wiring layer are formed on each first conductive wiring layer. At least one second through hole is defined in each insulating layer. The second through hole positioned near the first end portion extends to the first end portion and forms a recess. A conductive via is formed in each second through hole and the corresponding recess, and is electrically connected to the conductive paste block.

4 Claims, 13 Drawing Sheets

(51) Int. Cl.
*H05K 1/03* (2006.01)
*H05K 1/02* (2006.01)
*H05K 1/11* (2006.01)
*H05K 3/00* (2006.01)

(52) U.S. Cl.
CPC ........... *H05K 1/0393* (2013.01); *H05K 1/115* (2013.01); *H05K 3/0032* (2013.01); *H05K 3/0064* (2013.01); *H05K 3/4038* (2013.01); *Y10T 29/49155* (2015.01); *Y10T 29/49165* (2015.01)

(58) Field of Classification Search
CPC .. H05K 3/0032; H05K 3/0064; H05K 1/0353; H05K 1/0278; H05K 1/0393; H05K 1/115; Y10T 29/49165; Y10T 29/49155
USPC .......................................... 29/852, 846, 829
See application file for complete search history.

(56) References Cited

U.S. PATENT DOCUMENTS

| | | | | |
|---|---|---|---|---|
| 6,262,477 B1 * | 7/2001 | Mahulikar | ............ | H01L 23/055 257/698 |
| 6,376,052 B1 * | 4/2002 | Asai | ..................... | H05K 3/0094 174/255 |
| 6,930,258 B1 * | 8/2005 | Kawasaki | ......... | H01L 23/49811 174/255 |
| 7,540,082 B2 * | 6/2009 | Ohsumi | ............... | H05K 3/0094 174/255 |
| 8,710,374 B2 * | 4/2014 | Tsukada | ............... | H05K 3/4661 174/258 |
| 2004/0112637 A1 * | 6/2004 | Kim | ....................... | H05K 1/115 174/264 |
| 2005/0085065 A1 * | 4/2005 | Mok | ...................... | H05K 3/462 438/629 |
| 2006/0029726 A1 * | 2/2006 | Mok | ...................... | H05K 3/462 427/96.1 |
| 2007/0107934 A1 * | 5/2007 | Mok | ...................... | H05K 3/462 174/262 |
| 2011/0290549 A1 * | 12/2011 | Hirai | ..................... | H05K 3/4069 174/264 |
| 2012/0312590 A1 * | 12/2012 | Maeda | ................. | H05K 1/0269 174/261 |
| 2013/0149437 A1 * | 6/2013 | Oh | ....................... | C23C 18/1616 427/97.2 |

* cited by examiner

FLEXIBLE PRINTED CIRCUIT BOARD AND METHOD FOR MANUFACTURING THE SAME

FIELD

The subject matter herein generally relates to circuit boards, and particularly, to a flexible printed circuit board (FPCB) and a method for manufacturing the FPCB.

BACKGROUND

Double-sided FPCBs are widely used in various kinds of electronic devices. To make the FPCB, through holes are needed to be defined at opposite sides of the circuit substrate of the FPCB. Then, copper is plated in the through holes to form conductive vias that electrically connect the conductive wiring circuits on the opposite sides of the circuit substrate.

However, bubbles may occur during the plating of copper. The bubbles may burst when cured, which may decrease the quality of the FPCB.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIGS. 1 to 10, a method for making an FPCB 100 is presented in accordance with a first exemplary embodiment. The method for making the FPCB 100 is provided by way of example, as there are a variety of ways to carry out the method. The exemplary method can begin at step 1.

Figure 1:
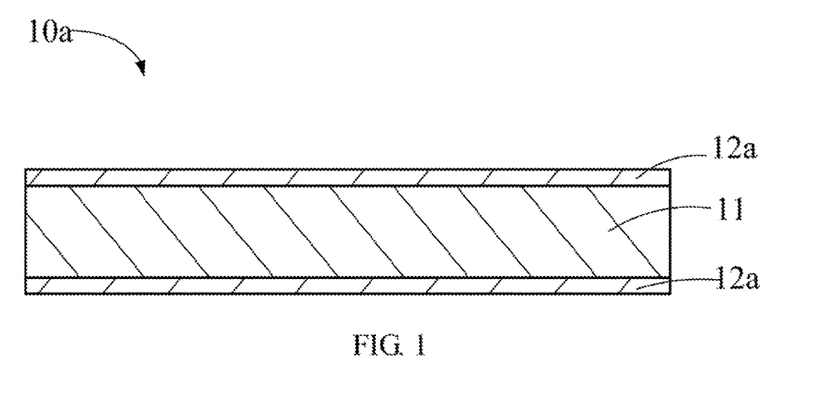
FIG. 1 is a diagram of an exemplary embodiment of a copper substrate comprising two opposing first copper foil layers.

At step 11, referring to FIG. 1, a copper substrate 10a is provided. The copper substrate 10a comprises a base layer 11 having opposite surfaces and a first copper foil layer 12a is formed on each surface of the base layer 11.

In at least one exemplary embodiment, the base layer 11 is made of a polymer selected from a group consisting of polyimide, polytetrafluoroethylene, poly thiamine, poly (methyl methacrylate), polycarbonate, polyethylene terephthalate, and polyimide-polyethyleneterephthalate, and any combination thereof.

Figure 2:
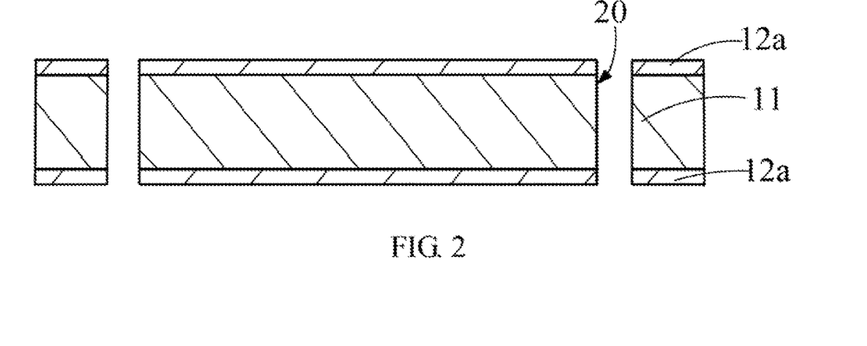
FIG. 2 is a diagram showing first through holes defined in the copper substrate of FIG. 1.

At step 12, referring to FIG. 2, at least one first through hole 20 is defined in the copper substrate 10a. Each first through hole 20 passes all the way through the base layer 11 and the two first copper foil layers 12a.

In at least one exemplary embodiment, each first through hole 20 is created using a laser.

Figure 3:
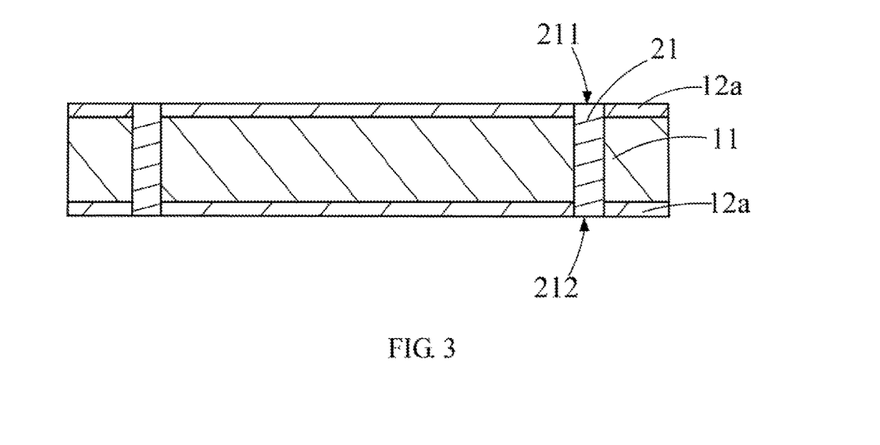
FIG. 3 is a diagram showing a conductive paste block formed in each first through hole of FIG. 2.

At step 13, referring to FIG. 3, conductive paste is filled into each first through hole 20 and cured, thereby forming a conductive paste block 21 that electrically connects the two first copper foil layers 12a to each other. Each conductive paste block 21 comprises a first end portion 211 and a second end portion 212 opposite to the first end portion 211. The first end portion 211 and the second end portion 212 both protrude from the base layer 11.

In at least one exemplary embodiment, the first end portion 211 and the second end portion 212 are both flush with the first copper foil layer 12a.

Figure 4:
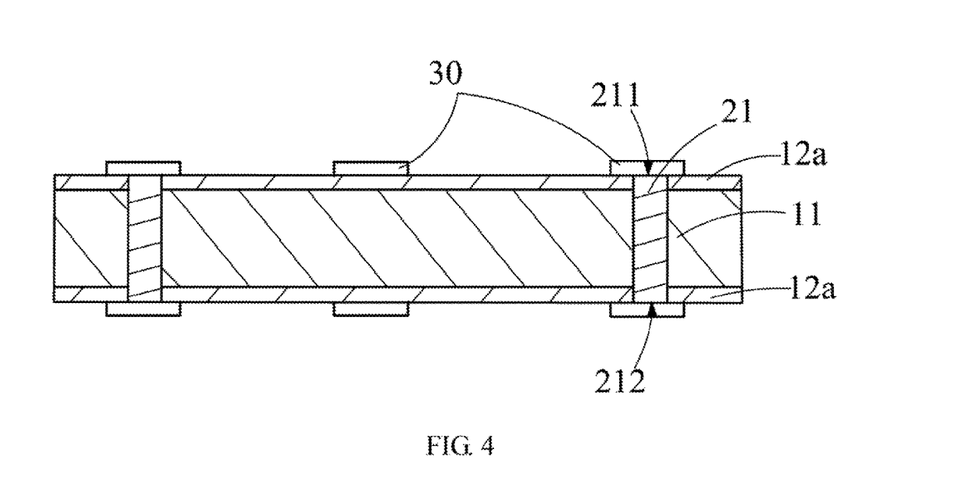
FIG. 4 is a diagram showing a dry film covering each first copper foil layer of FIG. 3.

At step 14, referring to FIG. 4, a dry film 30 is formed on each first copper foil layer 12a. Each dry film 30 covers the first end portion 211 or the second end portion 212, and further covers a portion of the first copper foil layer 12a surrounding the first end portion 211 or the second end portion 212.

Figure 5:
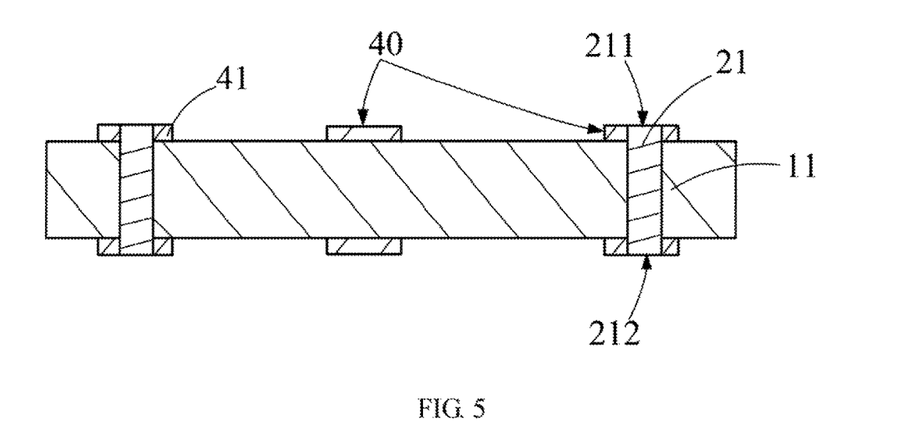
FIG. 5 is a diagram showing each first copper foil layer of FIG. 4 etched away to form a first conductive wiring layer.

At step 15, referring to FIG. 5, each first copper foil layer 12a is etched through the dry film 30, thereby forming a first conductive wiring layer 40. Each first conductive wiring layer 40 comprises a first annular ring 41 surrounding the first end portion 211 or the second end portion 212. The first end portion 211 and the second end portion 212 both exposed from the first annular ring 41.

Figure 6:
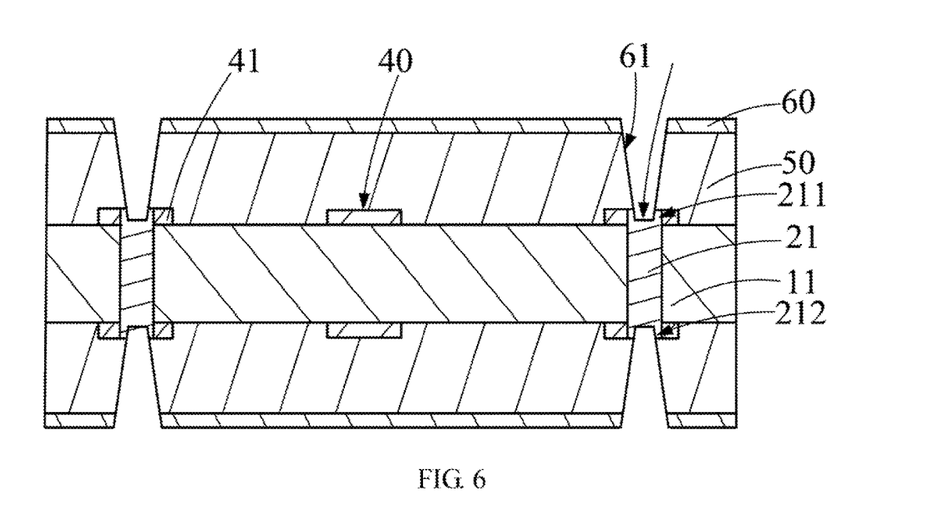
FIG. 6 is a diagram showing an insulating layer and a second copper foil layer covering each first conductive wiring layer of FIG. 5 and second through holes defined.

At step 16, referring to FIG. 6, an insulating layer 50 and a second copper foil layer 60 are successively formed on each first conductive wiring layer 40. At least one second through hole 61 is defined in each insulating layer 50 and the corresponding second copper foil layer 60. A second through hole 61 is coaxially aligned with each conductive paste block 21, and extends to the first end portion 211 or the second end portion 212. A recess 62 is formed in each of the first end portion 211 and the second end portion 212.

In at least one exemplary embodiment, each second through hole 61 is created using a laser.

Figure 7:
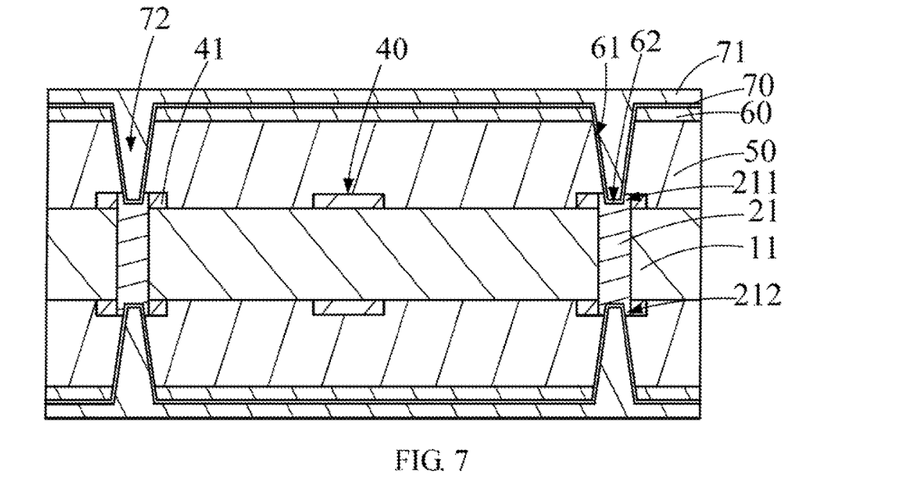
FIG. 7 is a diagram showing a conductive layer, a copper plating layer, and a conductive via formed on each second copper foil layer of FIG. 6.

At step 17, referring to FIG. 7, a conductive layer 70 is formed on each second copper foil layer 60, an inner wall of each second through hole 61, and contacting an inner wall of each recess 62. A copper plating layer 71 is formed on each conductive layer 70. Each copper plating layer 71 further fills in each second through hole 61 and the corresponding recess 62 containing the conductive layer 70, to form a conductive via 72. The conductive via 72 electrically connects two copper plating layers 71 through the conductive paste block 21.

In at least one exemplary embodiment, the conductive layer 70 can be a conductive seeding layer, a copper chemical-plating layer, or an organic conductive film. The organic conductive film can be made of manganese dioxide. The conductive layer 70 can also be omitted.

Figure 8:
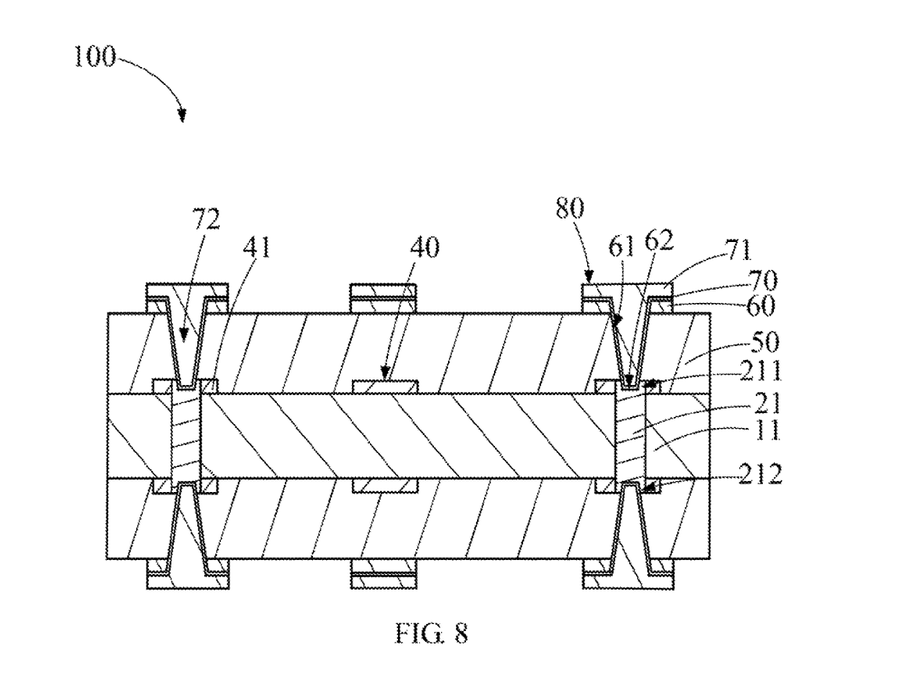
FIG. 8 is a diagram of an FPCB formed by etching away each conductive layer, each copper plating layer, and each second copper foil layer of FIG. 7.

At step 18, referring to FIG. 8, each copper plating layer 71, the corresponding conductive layer 70, and the corresponding second copper foil layer 60 are etched away to form a second conductive wiring layer 80, thereby forming the FPCB 100.

In another exemplary embodiment, the conductive layer 70 and the copper plating layer 71 can both be omitted. In this exemplary embodiment, the exemplary method goes to step 17' after step 16.

Figure 9:
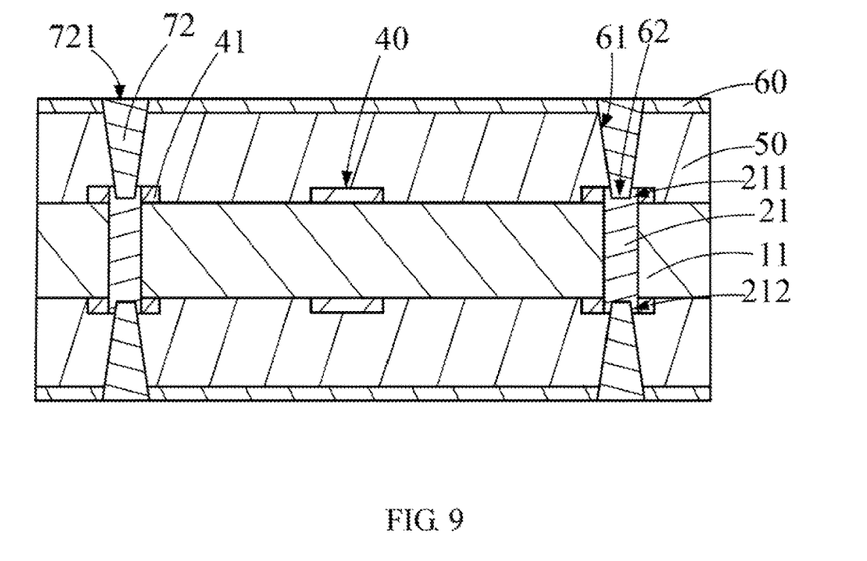
FIG. 9 is a diagram showing a conductive via formed in the second through hole of FIG. 6.

At step 17', referring to FIG. 9, conductive paste is filled into each second through hole 61 and the corresponding recess 62 and cured, thereby forming a conductive via 72.

In at least one exemplary embodiment, each conductive via 72 comprises two third end portions 721. Each third end portion 721 is flush with the corresponding second copper foil layer 60.

Figure 10:
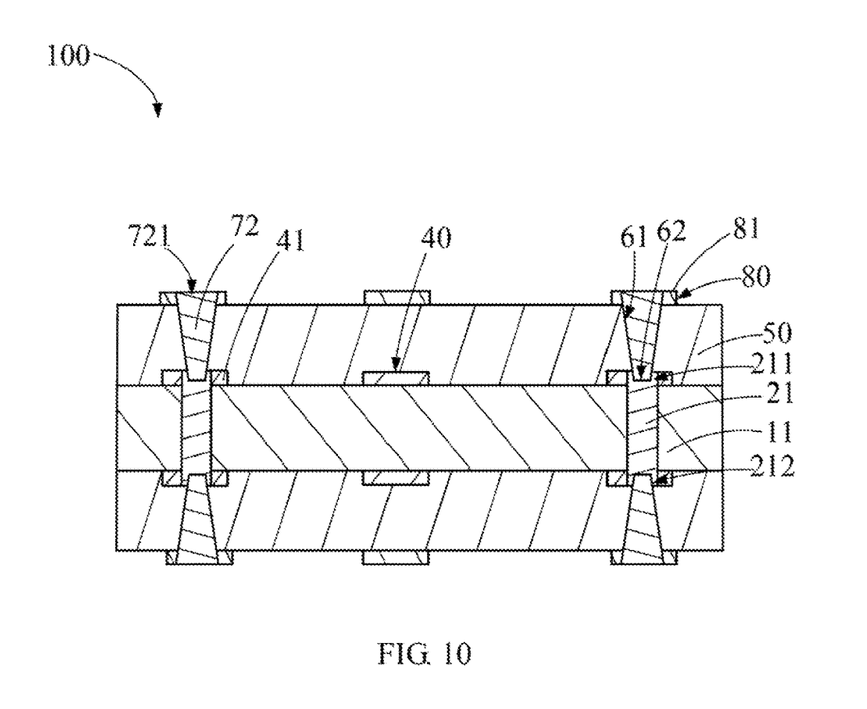
FIG. 10 is a diagram of another FPCB formed by etching away each second copper foil layer of FIG. 9.

At step 18', referring to FIG. 10, each second copper foil layer 60 is etched away to form a second conductive wiring layer 80, thereby forming the FPCB 100. Each second conductive wiring layer 80 comprises a second annular ring 81 surrounding the third end portion 721 facing away from the base layer 11. Each second annular ring 81 corresponds to one first annular ring 41.

In this exemplary embodiment, each second copper foil layer 60 is covered by a dry film (not shown). The dry film covers the third end portion 721 facing away from the base layer 11, and further covers a portion of the second copper foil layer 60 surrounding the third end portion 721. Each second copper foil layer 60 is etched through the dry film, thereby forming the second conductive wiring layer 80.

Referring to FIGS. 10 to 16, a method for making the FPCB 100 is presented in accordance with a second exemplary embodiment. The method for making the FPCB 100 is provided by way of example, as there are a variety of ways to carry out the method. The exemplary method can begin at step 21.

Figure 11:
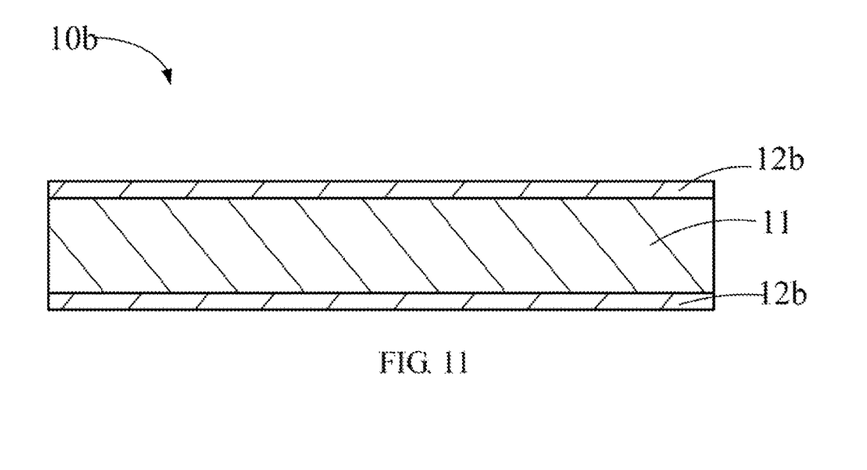
FIG. 11 is a diagram of another exemplary embodiment of an insulating laminate comprising two releasing films.

At step 21, referring to FIG. 11, an insulating laminate 10b is provided. The insulating laminate comprises a base layer 11 having opposite surfaces and a releasing film 12b is formed on the each surface of the base layer 11.

Figure 12:
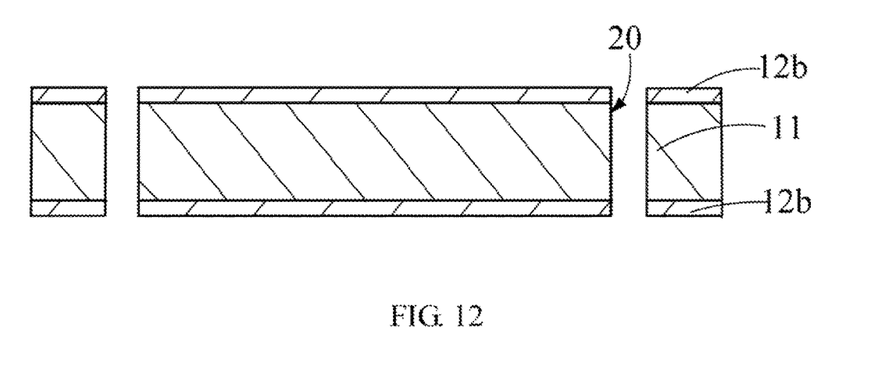
FIG. 12 is a diagram showing first through holes defined in the insulating laminate of FIG. 11.

At step 22, referring to FIG. 12, at least one first through hole 20 is defined in the insulating laminate 10b. Each first through hole 20 passes all the way through the base layer 11 and the two releasing films 12b.

Figure 13:
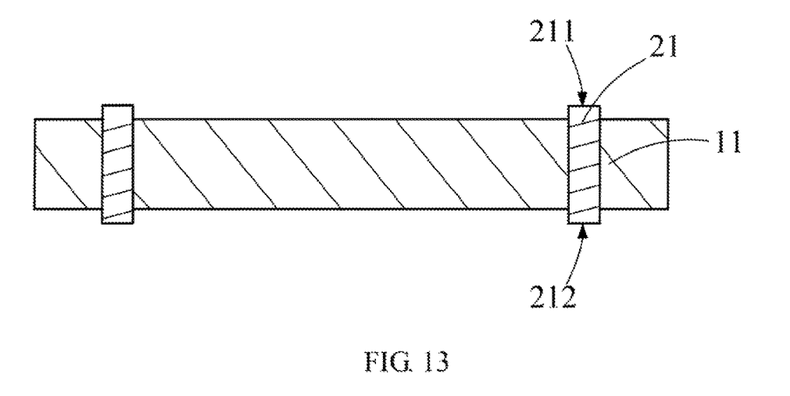
FIG. 13 is a diagram showing a conductive paste block formed in each first through hole of FIG. 2 and the releasing films removed.

At step 23, referring to FIG. 13, conductive paste is filled into each first through hole 20 and cured, thereby forming a conductive paste block 21. The two releasing films 12b are then removed. Each conductive paste block 21 comprises a first end portion 211 and a second end portion 212 opposite to the first end portion 211. The first end portion 211 and the second end portion 212 both protrude from the base layer 11.

Figure 14:
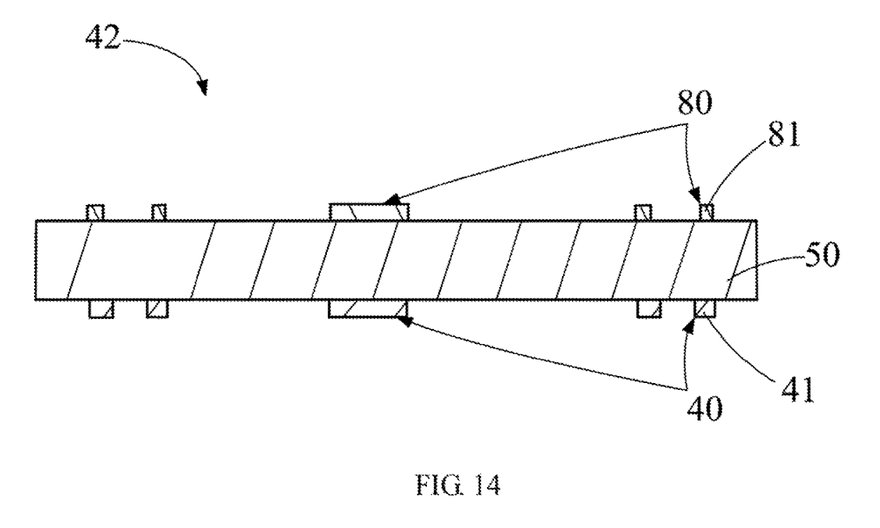
FIG. 14 is a diagram of a circuit laminate.

At step 24, referring to FIG. 14, two circuit laminate 42 are provided (only one shown). Each circuit laminate 42 comprises an insulating layer 50, a first conductive wiring layer 40, and a second conductive wiring layer 80. The first conductive wiring layer 40 and the second conductive wiring layer 80 are formed on opposite surfaces of the insulating layer 50. Each first conductive wiring layer 40 comprises at least one first annular ring 41. Each second conductive wiring layer 80 comprises at least one second annular ring 81. Each second annular ring 81 is coaxially aligned with one first annular ring 41.

Figure 15:
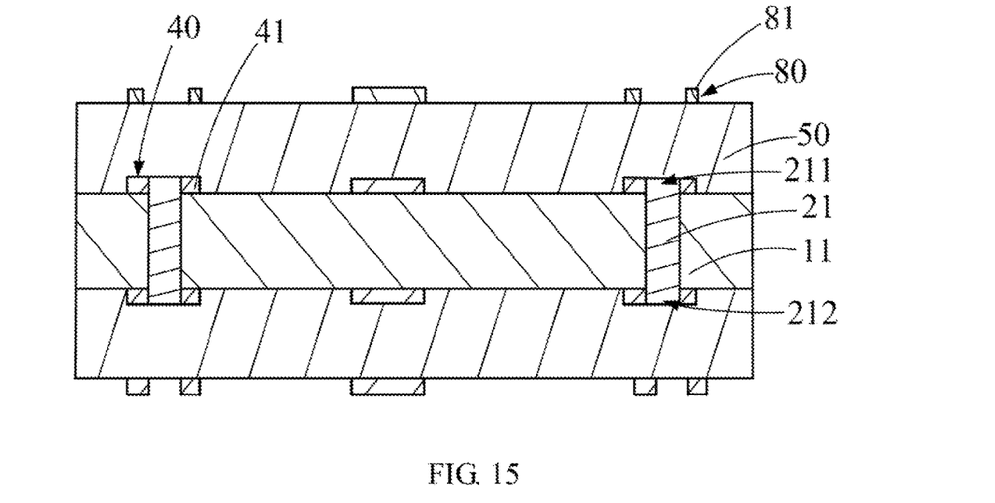
FIG. 15 is a diagram showing the circuit laminate of FIG. 14 formed on the insulating laminate of FIG. 13.

At step 25, referring to FIG. 15, each circuit laminate 42 covers one surface of the base layer 11 through an adhesive layer (not shown), to cause the first annular ring 41 of each conductive wiring layer 40 to surround the first end portion 211 or the second end portion 212. Thus, the first end portion 211 and the second end portion 212 are both exposed from the first annular ring 41.

Figure 16:
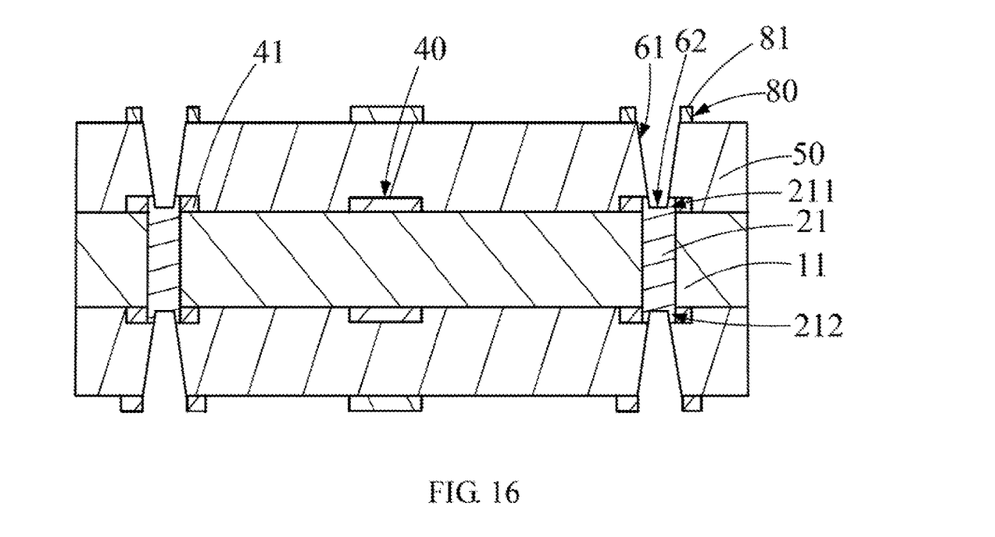
FIG. 16 is a diagram showing second through holes defined in the circuit laminate of FIG. 15.

At step 26, referring to FIG. 16, at least one second through hole 61 is defined in each insulating layer 50. A second through hole 61 is coaxially aligned with each conductive paste block 21, and extends to the first end portion 211 or the second end portion 212. A recess 62 is formed in each of the first end portion 211 and the second end portion 212.

At step 27, referring to FIG. 10, conductive paste is filled into each second through hole 61 and corresponding recess 62 and cured, thereby forming a conductive via 72 which electrically connects two second conductive wiring layers 80 through the conductive paste block 21. Then, the FPCB 100 is obtained.

Referring to FIGS. 1 and 17-25, a method for making an FPCB 200 is presented in accordance with a third exemplary embodiment. The method for making the FPCB 200 is provided by way of example, as there are a variety of ways to carry out the method. The exemplary method can begin at step 31.

At step 31, referring to FIG. 1, a copper substrate 10*a* is provided. The copper substrate comprises a base layer 11having opposite surfaces and a first copper foil layer 12*a* is formed on each surface of the base layer 11.

Figure 17:
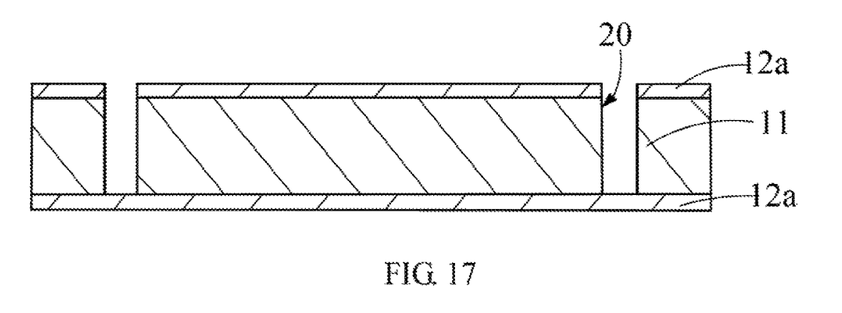
FIG. 17 is similar to FIG. 2, but showing the first through holes defined in the copper substrate, of another exemplary embodiment.

At step 32, referring to FIG. 17, at least one first through hole 20 is defined in the copper substrate 10*a*. Each first through hole 20 passes through the base layer 11 and only one first copper foil layer 12*a*. That is, the first through hole 20 does not pass all the way through both first copper foil layers 12*a*.

Figure 18:
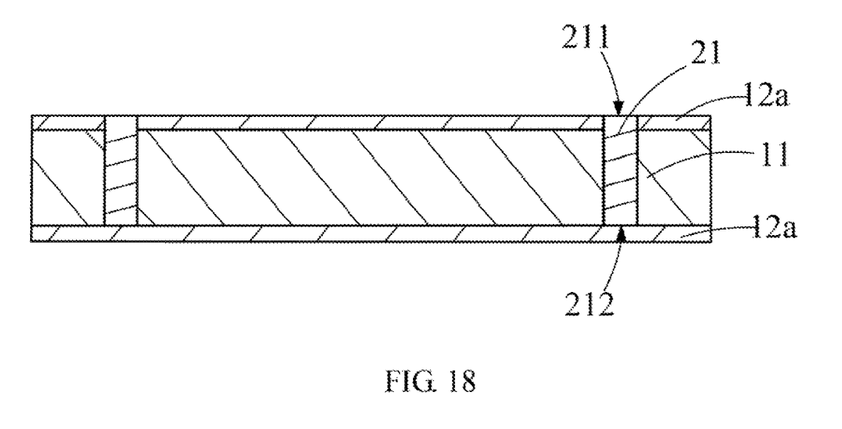
FIG. 18 is a diagram showing a conductive paste block formed in each first through hole of FIG. 17.

At step 33, referring to FIG. 18, conductive paste is filled into each first through hole 20 and cured, thereby forming a conductive paste block 21 that electrically connects the two first copper foil layers 12*a* to each other. Each conductive paste block 21 comprises a first end portion 211 and a second end portion 212 opposite to the first end portion 211. The first end portion 211 is positioned at an opening of the first through hole 20. The second end 212 is positioned at a blind end of the first through hole 20. The first end portion 211 protrudes from the base layer 11.

In at least one exemplary embodiment, the first end portion 211 is flush with the first copper foil layer 12*a*.

Figure 19:
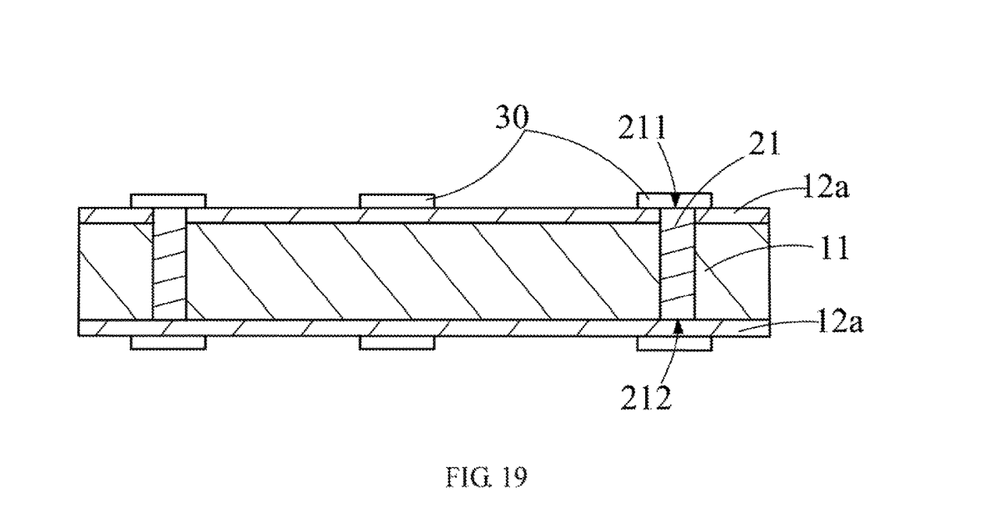
FIG. 19 is a diagram showing a dry film covering each first copper foil layer of FIG. 18.

At step 34, referring to FIG. 19, a dry film 30 is formed on each first copper foil layer 12*a*. The dry film 30 positioned near the first end portion 211 covers the first end portion 211 and a portion of the first copper foil layer 12*a* surrounding the first end portion 211.

Figure 20:
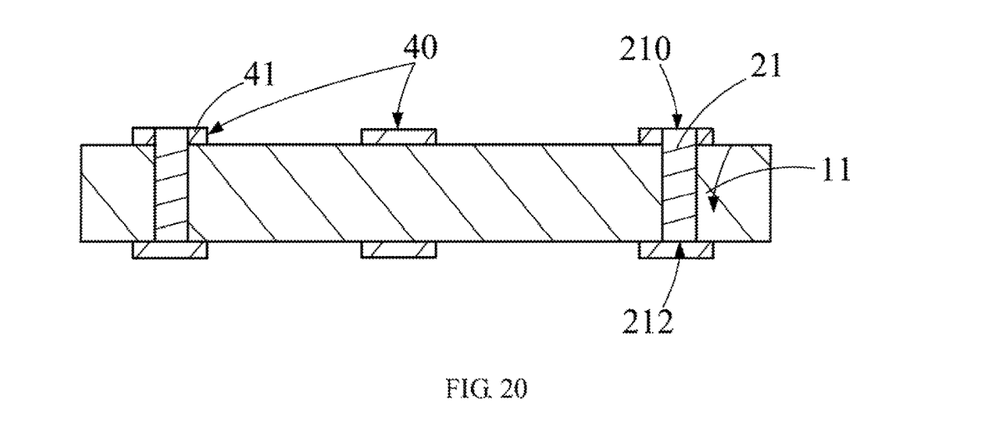
FIG. 20 is a diagram showing each first copper foil layer of FIG. 19 etched away to form a first conductive wiring layer.

At step 35, referring to FIG. 20, each first copper foil layer 12*a* is etched away through the dry film 30, thereby forming a first conductive wiring layer 40. The first conductive wiring layer 40 positioned near the first end portion 211 comprises a first annular ring 41 surrounding the first end portion 211. The first end portion 211 is exposed from the first annular ring 41.

Figure 21:
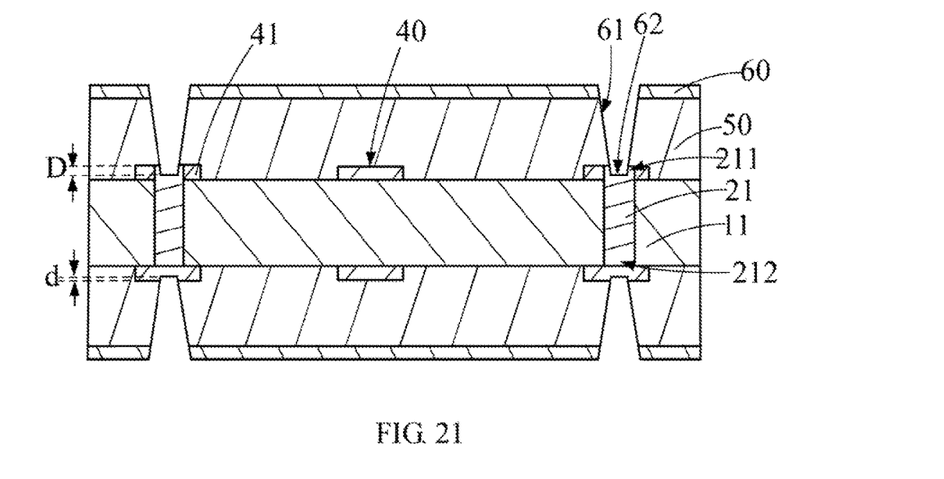
FIG. 21 is a diagram showing an insulating layer and a second copper foil layer covering each first conductive wiring layer of FIG. 20, and second through holes defined.

At step 36, referring to FIG. 21, an insulating layer 50 and a second copper foil layer 60 are successively formed on each first conductive wiring layer 40. At least one second through hole 61 is defined in each insulating layer 50 and the corresponding second copper foil layer 60. A second through hole 61 is coaxially aligned with each conductive paste block 21. The second through hole 61 positioned near the first end portion 211 extends to the first end portion 211 to form a recess 62 in the first end portion 211. The second through hole 61 positioned near the second end portion 212 extends to the first conductive wiring layer 40 to form another recess 62 in the first conductive wiring layer 40.

The second through hole 61 is created using a laser. Since the conductive paste block 21 is more vulnerable to laser compared to the first conductive wiring layer 40, the recess 62 extending to the first end portion 211 has a greater depth compared to the recess 62 extending to the first conductive wiring layer 40 (D>d).

Figure 22:
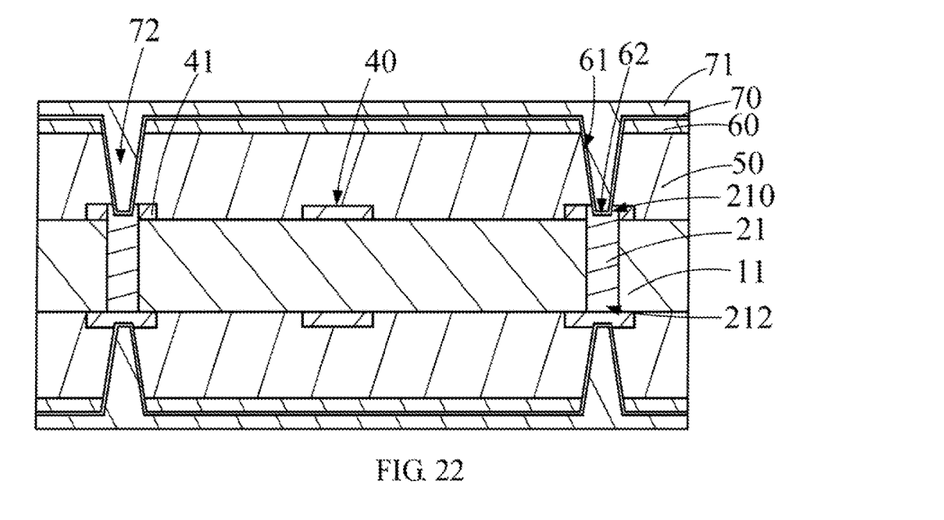
FIG. 22 is a diagram showing a conductive layer, a copper plating layer, and a conductive via formed on each second copper foil layer of FIG. 21.

At step 37, referring to FIG. 22, a conductive layer 70 is formed on each second copper foil layer 60, an inner wall of each second through hole 61, and contacting an inner wall of each recess 62. A copper plating layer 71 is formed on each conductive layer 70. Each copper plating layer 71 further fills in each second through hole 61 and the corresponding recess 62 containing the conductive layer 70, to form a conductive via 72. The conductive layer 70 can also be omitted.

Figure 23:
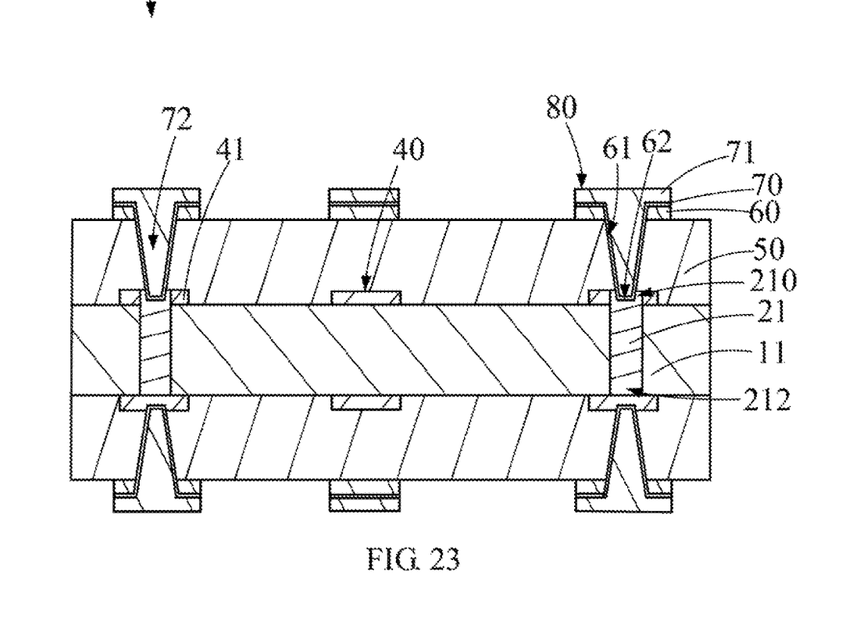
FIG. 23 is a diagram of an FPCB formed by etching away each conductive layer, each copper plating layer, and each second copper foil layer of FIG. 22.

At step 38, referring to FIG. 23, each copper plating layer 71, the corresponding conductive layer 70, and the corresponding second copper foil layer 60 are etched away to form a second conductive wiring layer 80, thereby forming the FPCB 200.

In another exemplary embodiment, the conductive layer 70 and the copper plating layer 71 can both be omitted. In this exemplary embodiment, the exemplary method goes to step 37' after step 36.

Figure 24:
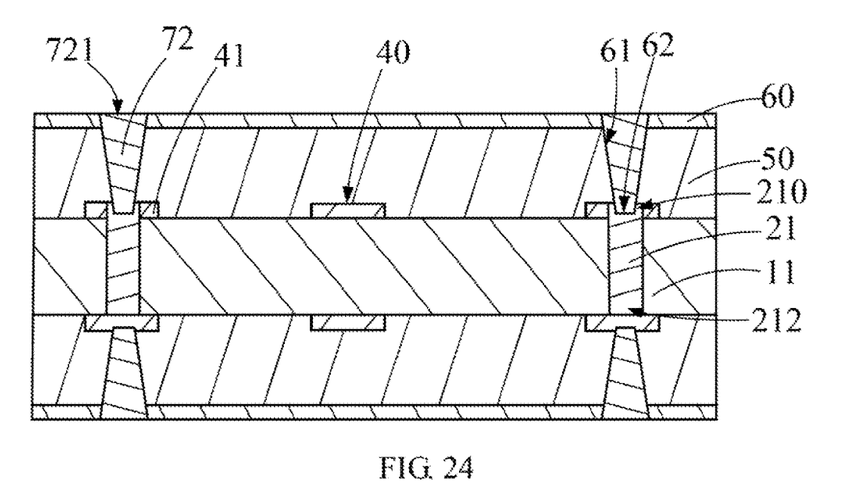
FIG. 24 is a diagram showing a conductive via formed in the second through hole of FIG. 21.

At step 37', referring to FIG. 24, conductive paste is filled into each second through hole 61 and the corresponding recess 62 and cured, thereby forming a conductive via 72.

In at least one exemplary embodiment, each conductive via 72 comprises two third end portions 721. Each third end portion 721 is flush with the corresponding second copper foil layer 60.

Figure 25:
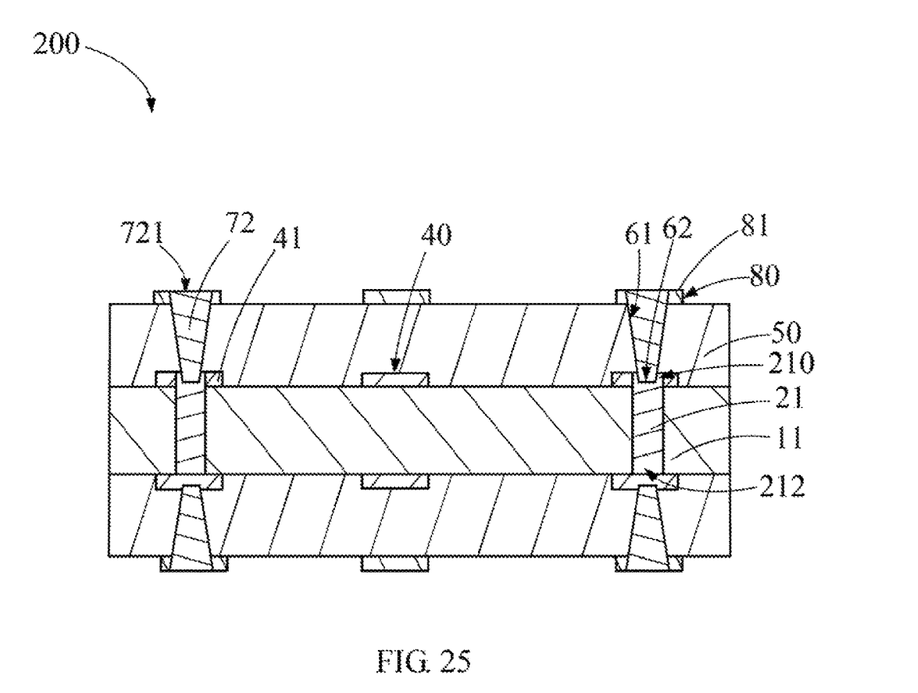
FIG. 25 is a diagram of another FPCB formed by etching away each second copper foil layer of FIG. 24.

At step 38', referring to FIG. 25, each second copper foil layer 60 is etched away to form a second conductive wiring layer 80, thereby forming the FPCB 100. Each second conductive wiring layer 80 comprises a second annular ring 81 surrounding the third end portion 721 facing away from the base layer 11.

FIGS. 8 and 10 illustrate a first exemplary embodiment of an FPCB 100. The FPCB 100 comprises a base layer 11 having opposite surfaces and a first conductive wiring layer 40 is formed on each surface of the base layer 11. The base layer 11 defines at least one first through hole 20 passing through the base layer 11. A conductive paste block 21 is formed in each first through hole 20. Each conductive paste block 21 comprises a first end portion 211 and a second end portion 212 opposite to the first end portion 211. The first end portion 211 and the second end portion 212 both protrude from the base layer 11 and are exposed from the first conductive wiring layers 40. In at least one exemplary embodiment, the first end portion 211 and the second end portion 212 are both flush with the first conductive wiring layers 40. Each first conductive wiring layer 40 comprises a first annular ring 41 surrounding the first end portion 211 or the second end portion 212.

An insulating layer 50 and a second conductive wiring layer 80 are successively formed on each first conductive wiring layer 40. At least one second through hole 61 is defined in each insulating layer 50. A second through hole 61 is coaxially aligned with each conductive paste block 21, and extends to the first end portion 211 or the second end portion 212. A recess 62 is formed in each of the first end portion 211 and the second end portion 212.

In at least one exemplary embodiment, each second conductive wiring layer 80 comprises a second copper foil layer 60, a conductive layer 70, and a copper plating layer 71 successively formed on the insulating layer 50. The conductive layer 70 is further formed on an inner wall of each second through hole 61, and contacting an inner wall of each recess 62. The copper plating layer 71 further fills in each second through hole 61 and the corresponding recess 62 containing the conductive layer 70, to form a conductive via 72 (shown in FIG. 8). The conductive layer 70 can also be omitted.

In another exemplary embodiment, the conductive via 72 is made of conductive paste. Each second conductive wiring layer 80 comprises a second annular ring 81 (shown in FIG. 10) surrounding the third end portion 721 facing away from the base layer 11. The third portion 721 is flush with the second conductive wiring layer 80.

FIGS. 23 and 25 illustrate a second exemplary embodiment of an FPCB 200. Different from the FPCB 100, each first through hole 20 passes through the base layer 11 and only one first conductive wiring layer 40. That is, the first through hole 20 does not pass through both first conductive wiring layers 40. In this exemplary embodiment, only the first end portion 211 of each conductive paste block 21 protrudes from the base layer 11 and is exposed from the first conductive wiring layer 40. The first conductive wiring layer 40 positioned near the first end portion 211 comprises a first annular ring 41 surrounding the first end portion 211. The second through hole 61 positioned near the first end portion 211 extends to the first end portion 211 to form a recess 62 in the first end portion 211. The second through hole 61 positioned near the second end portion 212 extends to the first conductive wiring layer 40 to form another recess 62 in the first conductive wiring layer 40. The recess 62 extending to the first end portion 211 has a greater depth compared to the recess 62 extending to the first conductive wiring layer 40.

With the above configuration, the base layer 11 defines the first through hole 20. The conductive paste block 21 is formed in each first through hole 20. Furthermore, the second through hole 61 is defined at two sides of the base layer 11, and the second through hole 61 extends to the first end portion 211 and the second end portion 212 of the conductive paste block 21 to form the recesses 62. Thus, after the second through hole 61 is filled with conductive material (for example, plated copper or conductive paste), the conductive via 72 formed in the second through hole 61 can be electrically connected to the conductive paste block 21. For the FPCBs 100 and 200, having a preset thickness, the depths of the second through hole 61 is decreased, which can avoid the generation of bubbles.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making a flexible printed circuit board comprising:
   providing an insulating laminate comprising a base layer, the base layer having two opposite surfaces, a releasing films formed on each surface of the base layer;
   defining at least one first through hole in the insulating laminate, each first through hole passing through the base layer and the two releasing films;
   forming a conductive paste block in each first through hole, each conductive paste block comprises a first end portion and a second end portion opposite to the first end portion, at least the first end portion protruding from the base layer;
   removing the releasing films;
   forming a first conductive wiring layer, an insulating layer, and a second conductive wiring layer on each surface of the base layer and in that order, the first end portion of each conductive paste block exposed from the first conductive wiring layer;
   defining at least one second through hole in the insulating layer, the second through hole coaxially aligned with each conductive paste block, the second through hole positioned near the first end portion extending to the first end portion and forming a recess in the first end portion; and
   forming a conductive via in each second through hole and the correspond recess.

2. The method of claim 1, wherein the second conductive wiring layer and the conductive via are formed by:
   filling conductive paste in each second through hole and the corresponding recess to form the conductive via; and
   etching away each second copper foil layer to form the second conductive wiring layer.

3. The method of claim 1, wherein the first conductive wiring layer, the insulating layer, and the second conductive wiring layer are formed by:
   providing two circuit laminates, each circuit laminate comprising the insulating layer, and the first conductive wiring layer and the second conductive wiring layer formed on opposite surfaces of the insulating layer, each first conductive wiring layer comprising at least one first annular ring; and
   covering each circuit laminate on one surface of the base layer, to cause the first annular ring of each conductive wiring layer to surround the first end portion or the second end portion.

4. The method of claim 3, wherein the conductive via is formed by:
   filling conductive paste in each second through hole and the corresponding recess; and
   curing the conductive paste.

* * * * *